United States Patent
Ahn et al.

(10) Patent No.: US 7,888,715 B2
(45) Date of Patent: Feb. 15, 2011

(54) ACTIVE PIXEL SENSOR WITH COUPLED GATE TRANSFER TRANSISTOR

(75) Inventors: Jung-Chak Ahn, Suwon-si (KR); Tetsuo Asaba, Suwon-si (KR); Young-Chan Kim, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 989 days.

(21) Appl. No.: 11/317,356

(22) Filed: Dec. 23, 2005

(65) Prior Publication Data
US 2006/0138489 A1    Jun. 29, 2006

(30) Foreign Application Priority Data
Dec. 24, 2004    (KR) .............................. 2004-111655

(51) Int. Cl.
*H01L 27/144* (2006.01)
(52) U.S. Cl. ............................... 257/292; 257/E27.131
(58) Field of Classification Search ................. 257/292, 257/E27.131–E27.133
See application file for complete search history.

(56) References Cited

U.S. PATENT DOCUMENTS

| | | | |
|---|---|---|---|
| 5,608,243 A * | 3/1997 | Chi et al. ..................... | 257/249 |
| 5,973,311 A | 10/1999 | Sauer et al. | |
| 2006/0118835 A1* | 6/2006 | Ellis-Monaghan et al. .. | 257/292 |
| 2006/0138581 A1* | 6/2006 | Ladd .......................... | 257/462 |
| 2006/0226428 A1* | 10/2006 | Mouli ......................... | 257/59 |
| 2008/0099807 A1* | 5/2008 | Kim et al. ................... | 257/292 |

FOREIGN PATENT DOCUMENTS

| | | |
|---|---|---|
| JP | 2001-339639 | 7/2001 |
| KR | 2004-69183 | 4/2004 |

* cited by examiner

*Primary Examiner*—Lynne A Gurley
*Assistant Examiner*—Colleen A Matthews
(74) *Attorney, Agent, or Firm*—F. Chau & Associates, LLC

(57) ABSTRACT

A complementary metal-oxide semiconductor (CMOS) active pixel sensor includes a photodiode, a transfer transistor with a coupled gate, a reset transistor and a signal transfer circuit, where the photodiode generates electric charges in response to incident light, the transfer transistor transfers the electric charges integrated in the photodiode to a floating diffusion node, wherein the transfer transistor has a first transfer gate and a second transfer gate, and the first and second transfer gates have a coupled gate structure, the reset transistor resets a potential level of the floating diffusion node by a given voltage level, the signal transfer circuit transfers the potential level of the floating diffusion node to an internal circuit in response to a selection signal, and the CMOS active pixel sensor with the coupled gate may increase a capacity of the photodiode and reduce an image lag by using a voltage coupling effect of the coupled gate.

16 Claims, 7 Drawing Sheets

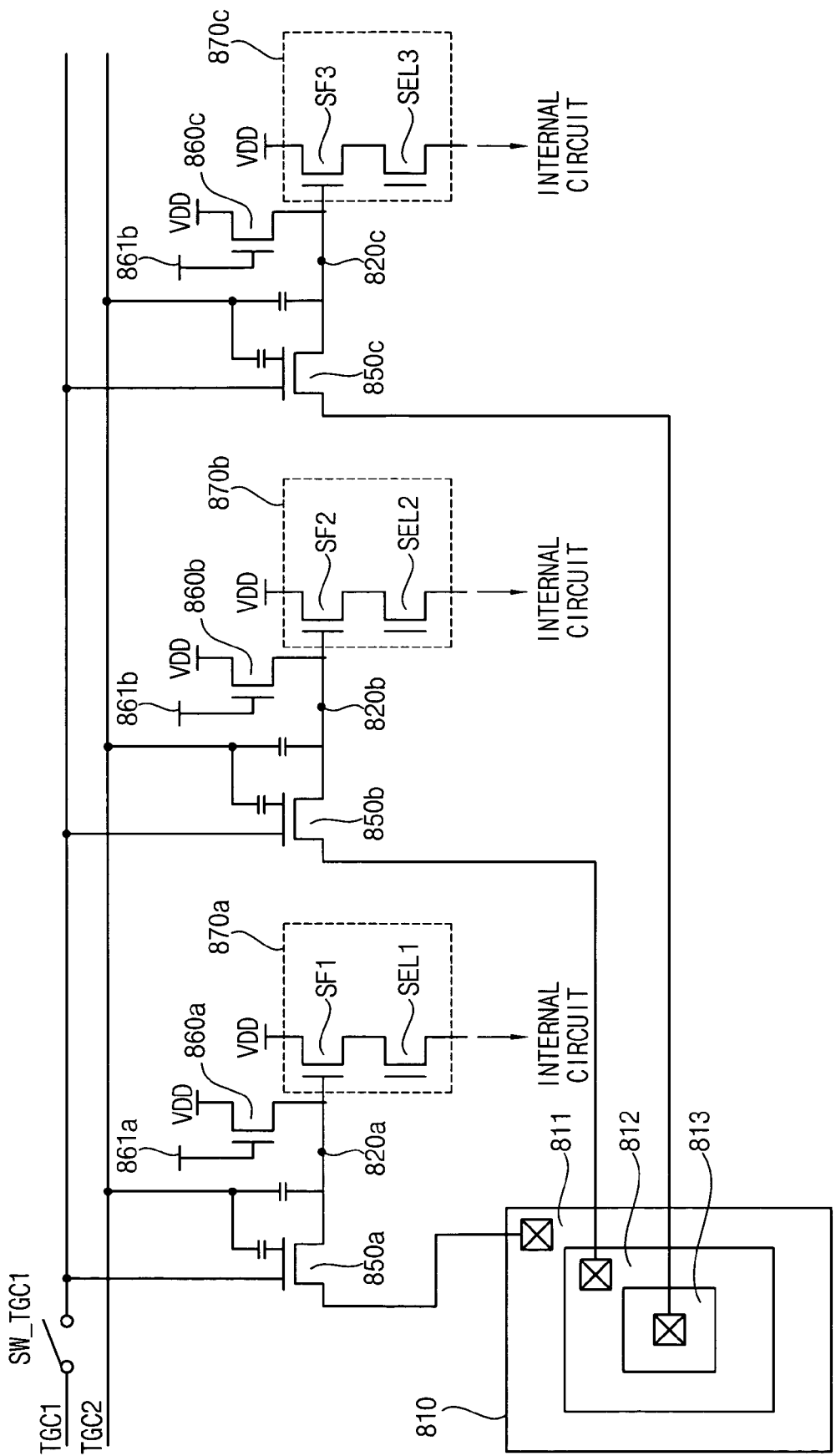

ACTIVE PIXEL SENSOR WITH COUPLED GATE TRANSFER TRANSISTOR

CROSS-REFERENCE TO RELATED APPLICATION

This application claims the benefit under 35 U.S.C. §119 of Korean Patent Application No. 2004-111655, filed on Dec. 24, 2004, which is herein incorporated by reference in its entirety.

BACKGROUND OF THE INVENTION

1. Field of the Invention

The present disclosure relates to active pixel sensors, and more particularly relates to metal-oxide semiconductor active pixel sensors.

2. Description of the Related Art

Active pixel sensors (APS) convert photo images into electric signals, and are widely used in digital cameras, mobile phones with built-in cameras, monitoring systems, and the like.

Presently, active pixel sensors are roughly classified as a type of charge coupled device (CCD) and a type of complementary metal-oxide semiconductor (CMOS). The CCD type generally has lower noise levels and better image quality than the CMOS type, but has disadvantages in manufacturing costs and power consumption. The APS of the CMOS type can be manufactured by common semiconductor manufacturing technologies, and easily integrated into other systems such as amplifiers or signal processing units. The CMOS type also has high processing speeds and much lower power consumption than the CCD type.

The CMOS type, however, is disadvantageous in terms of noise and image quality, due to a low signal-to-noise ratio (SNR) and a narrow signal dynamic range.

A one-transistor structure and a three-transistor structure were used in the past for manufacturing the CMOS active pixel sensors, but as of recently, a four-transistor structure is being commonly used for manufacturing the CMOS active pixel sensors. In the four-transistor structure, one pixel of the CMOS sensors is composed of a photodiode and four MOS transistors. Photo-generated charges integrated in the photodiode are transferred under the control of the four transistors.

FIG. 1 is a cross-sectional view of a four-transistor CMOS active pixel sensor according to a generally conventional example. Referring to FIG. 1, a four-transistor CMOS sensor 100 includes a photodiode area 110, and N-type regions 120 and 130 formed upon a P-type silicon substrate 101. An insulation layer 140 is formed over the photodiode area 110 and the N-type areas 120 and 130. For example, the insulation layer 140 may include a SiO2 layer.

A transfer gate electrode TG and a reset gate electrode RG are formed on the insulation layer 140. A transfer gate control line TGC and a reset gate control line RGC are respectively connected to the transfer gate electrode TG and the reset gate electrode RG.

The N-type area 120 acts as a floating diffusion node. The pixel 100 further includes a source follower transistor SF for detecting signals from the N-type area 120, as well as a selection transistor SEL to be turned on in response to a selection signal of a selection signal line SELC.

The photodiode area 110 appears to occupy a narrow area in the cross-sectional view, but actually occupies an area larger than that of the N-type areas 120 and 130, so as to generate photoelectrons. A shield layer, not shown in FIG. 1, is formed over areas other than the photodiode area 110 so as to prevent light from being incident on the other areas.

MOS transistors 150 and 160 are respectively formed by the N-type areas 120 and 130 along with the electrodes TG and RG formed on the insulation layer 140 of the silicon substrate.

The transfer transistor 150 is controlled by a transfer control signal of the transfer gate control line TGC connected to the transfer gate electrode TG, and transfers photoelectrons integrated within the photodiode area 110 to the floating diffusion node 120. The reset transistor 160 is controlled by a reset control signal of the reset gate control line RGC connected to the reset gate electrode RG, and resets an initial potential of the floating diffusion node 120.

The source follower transistor SF detects a potential variation of the floating diffusion node 120, and transfers the detected potential of the floating diffusion node 120 to internal circuits (not shown) in the next stage of the CMOS active pixel sensor under the control of the selection transistor SEL. The internal circuits may include an amplifier, a sampling circuit for sampling the transferred signal, and the like.

Operations of the active pixel sensor in FIG. 1 are performed as follows. When a voltage level of the reset gate electrode RG is raised by the reset gate control line RGC and the reset transistor 160 is turned on, a voltage level of the floating diffusion node 120 increases up to a power supply voltage VDD. The source follower transistor SF and the selection transistor SEL perform a first sampling of a potential of the floating diffusion node 120, and the potential is referred to as a reference potential.

While external light is incident onto the photodiode areas 110 during a photo integration period, electron-hole pairs are generated in proportion to the amount of the incident light. Next, when voltage of the transfer gate electrode TG is raised by the transfer control signal of the transfer gate control line TGC, a channel is formed beneath the transfer gate electrode TG and electrons integrated within the photodiode area 110 are transferred to the floating diffusion node 120. The potential of the floating diffusion node 120 drops in proportion to the amount of the transferred electrons, and then a potential of the source of the source follower transistor SF is altered.

Finally, the selection transistor SEL is turned on, and the potential of the floating diffusion node 120 is transferred through the source follower transistor SF. A photo sensing is completed by obtaining a difference between the reference potential and the detected potential of the floating diffusion node 120 (which is referred to as a correlated double sampling). Then, the operations are repeated from the reset operation.

As illustrated above, the active pixel sensor 100 senses signals based on the potential variation of the floating diffusion node. This is a potential difference between an initial potential, which is raised up to a given level, of the floating diffusion node 120 of the active pixel sensor 100 and a sampled potential lowered due to the amount of electrons transferred from the photodiode.

Therefore, a range of the potential difference of the floating diffusion node 120 of the active pixel sensor 100 represents a dynamic range of light signals sensed by the active pixel sensor 100, and it is advantageous to raise the initial potential of the floating diffusion node 120 up to as high a level as possible, and then to lower the initial potential of the floating diffusion node 120. However, when a power supply having a limited voltage level is used, it is difficult to raise the initial potential of the floating diffusion node 120 beyond a given potential level.

Failure to empty all photoelectrons within the photodiode at one sensing operation causes an image lag. To empty all photoelectrons in one sensing operation, the higher potential of the transfer gate electrode is preferred. However, when power supplies having limited voltage levels are used, it is still difficult to raise the initial potential of the floating diffusion node 120 beyond the given potential level.

SUMMARY OF THE INVENTION

Exemplary embodiments of the present disclosure provide an active pixel sensor having an improved dynamic range of light signals and reduced image lag.

Other exemplary embodiments of the present disclosure provide an active pixel sensor array with a shared structure using the active pixel sensors having an improved dynamic range of light signals and reduced image lag.

Still other exemplary embodiments of the present disclosure provide an active pixel sensor adopting a multi-layer photodiode structure having an improved dynamic range of light signals and reduced image lag.

According to exemplary embodiments of the disclosure, a complementary metal-oxide semiconductor (CMOS) active pixel sensor includes a photodiode, a transfer transistor, a reset transistor and a signal transfer circuit. The photodiode generates electric charges in response to an incident light. The transfer transistor transfers the electric charges integrated in the photodiode to a floating diffusion node, wherein the transfer transistor has a first transfer gate and a second transfer gate, and the first and second transfer gates have a coupled gate structure. The reset transistor resets a potential level of the floating diffusion node by a given voltage level. The signal transfer circuit transfers the potential level of the floating diffusion node to an internal circuit in response to a selection signal.

The transfer transistor may bootstrap a voltage of the second transfer gate by using a voltage coupling effect between the first transfer gate and the second transfer gate. The second transfer gate may be placed substantially over the first transfer gate, or be placed over the floating diffusion node. The second transfer gate may cover a portion of the first transfer gate and a portion of the floating diffusion node.

The CMOS active pixel sensor may couple the power supply voltage to the first transfer gate by the switch during a given time period before disconnecting the power supply voltage, and then couple the power supply voltage to the second transfer gate, while the first transfer gate is at a floating state, to bootstrap a voltage level of the second transfer gate above the power source voltage by the voltage coupling effect. Meanwhile, the potential level of the floating diffusion node may be sampled by a correlated double sampling method, where a first sampling is performed while the voltage level of the second transfer gate is bootstrapped over the power source voltage by the voltage coupling effect.

The signal transfer circuit may include a source follower transistor for receiving the potential level of the floating diffusion node via a gate of the source follower transistor, and a selection transistor for transferring the potential level of a source of the source follower transistor to the internal circuit in response to the selection signal. The photodiode may include a pinned photodiode having a pinned surface.

According to another embodiment of the disclosure, a shared structure active pixel sensor array, with a plurality of complementary metal-oxide semiconductor (CMOS) active pixel sensors, includes a plurality of photodiodes, a plurality of transfer transistors, a reset transistor and a signal transfer circuit. The photodiodes generate electric charges in response to incident light. The plurality of transfer transistors transfer the electric charges integrated in the photodiodes to a floating diffusion node, wherein each of the transfer transistors has a first transfer gate and a second transfer gate, and the first and second transfer gates are configured as a coupled gate structure. The reset transistor resets a potential level of the floating diffusion node by a given voltage level. The signal transfer circuit transfers the potential level of the floating diffusion node to an internal circuit in response to a selection signal. Each of the transfer transistors may bootstrap a voltage of the second transfer gate by using a voltage coupling effect between the first transfer gate and the second transfer gate.

The second transfer gate may be placed substantially over the first transfer gate or may be placed over the floating diffusion node. The second transfer gate may cover a portion of the first transfer gate and a portion of the floating diffusion node.

Each of the CMOS active pixel sensors may couple the power supply voltage to the first transfer gate by the switch during a given time period before disconnecting the power supply voltage, and then couple the power supply voltage to the second transfer gate, while the first transfer gate is at a floating state, to bootstrap the voltage level of the second transfer gate above the power supply voltage by a voltage coupling effect.

Each of the CMOS active pixel sensors may sample the potential level of the floating diffusion node by a correlated double sampling method, where a first sampling is performed while the voltage level of the second transfer gate is bootstrapped over the power supply voltage by the voltage coupling effect. The signal transfer circuit may include a source follower transistor that receives the potential level of the floating diffusion node via a gate of the source follower transistor, and a selection transistor that transfers the potential level of a source of the source follower transistor to the internal circuit in response to the selection signal. Each of the photodiodes may include a pinned photodiode having a pinned surface.

According to another embodiment of the disclosure, a complementary metal-oxide semiconductor (CMOS) active pixel sensor, with a multilayered photodiode structure, includes a multilayered photodiode region, a plurality of transfer transistors, a plurality of reset transistors, and a plurality of signal transfer circuits. The multilayered photodiode region, which is formed on a substrate, includes a red light sensing region, a green light sensing region and a blue light-sensing region, for generating electric charges in response to corresponding wavelengths. The plurality of transfer transistors transfer the electric charges integrated in the respective light sensing regions to respective floating diffusion nodes of the corresponding light sensing regions, wherein each of the transfer transistors has a first transfer gate and a second transfer gate, and the first and second transfer gates have a coupled gate structure. The plurality of reset transistors reset potential levels of the respective floating diffusion nodes by respectively given voltage levels. The signal transfer circuits transfer the potential levels of the respective floating diffusion nodes to an internal circuit in response to respective selection signals.

The multilayered photodiode region may include a first n-type region formed on a p-type substrate, a first p-type region buried in the first n-type region, and a second n-type region buried in the first p-type region, wherein the blue light sensing region is formed at a first pn junction between the p-type substrate and the first n-type region, and the green light sensing region is formed at a second pn junction between the first n-type region and the first p-type region, and the red light sensing region is formed at a third pn junction between the first p-type region and the second n-type region.

The multilayered photodiode region may include a first p-type region formed on an n-type substrate, a first n-type region buried in the first p-type region, and a second p-type region buried in the first n-type region, wherein the blue light sensing region is formed at a first pn junction between the n-type substrate and the first p-type region, and the green light sensing region is formed at a second pn junction between the first p-type region and the first n-type region, and the red light sensing region is formed at a third pn junction between the first n-type region and the second p-type region.

The second transfer gate may be placed substantially over the first transfer gate or may be placed over the floating diffusion node. The second transfer gate may cover a portion of the first transfer gate and a portion of the floating diffusion node.

The CMOS active pixel sensor may further include a first transfer gate control line through which a power supply voltage is provided to the first transfer gate of the transfer transistor, a second transfer gate control line through which the power supply voltage is provided to the second transfer gate of the transfer transistor, and a switch for connecting and disconnecting the power supply voltage to the first transfer gate.

The CMOS active pixel sensor may couple the power supply voltage to the first transfer gate by the switch during a given time period before disconnecting the power supply voltage, and then may couple the power supply voltage to the second transfer gate, while the first transfer gate is at a floating state, to bootstrap the voltage level of the second transfer gate above the power supply voltage by the voltage coupling effect.

The potential level of the floating diffusion node may be sampled by a correlated double sampling method, where a first sampling is performed to bootstrap the voltage level of the second transfer gate over the power supply voltage by the voltage coupling effect.

BRIEF DESCRIPTION OF THE DRAWINGS

FIG. 8 is a circuit diagram illustrating a CMOS active pixel sensor with a multi-layer photodiode structure according to another exemplary embodiment of the present disclosure.

DETAILED DESCRIPTION OF PREFERRED EMBODIMENTS

Figure 1:
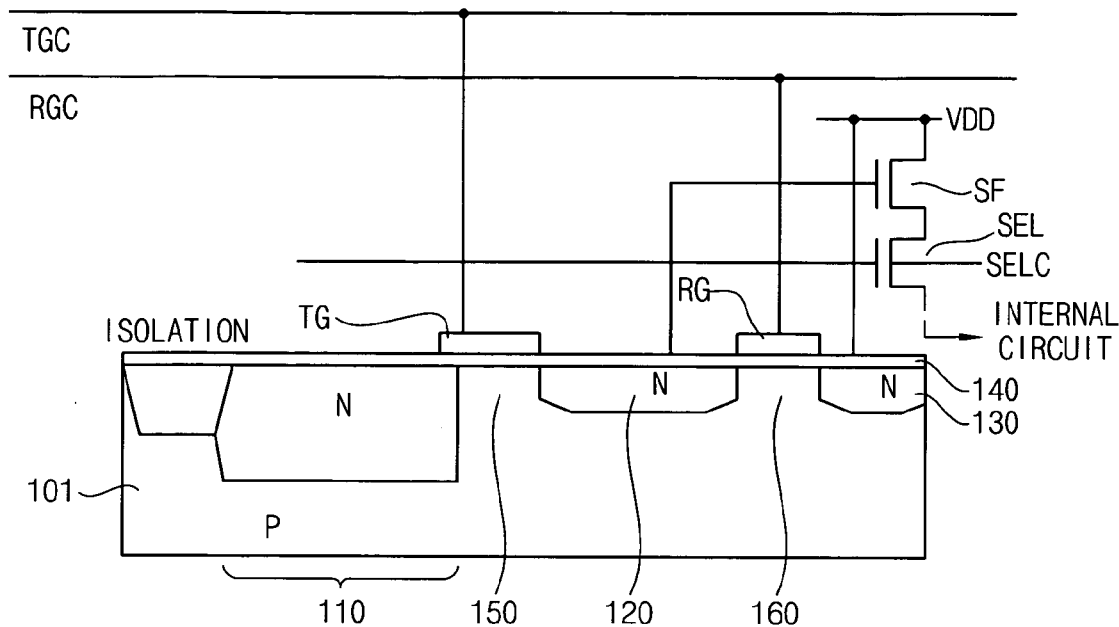
FIG. 1 is a cross-section of a four-transistor CMOS APS according to a generally conventional example.

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals may refer to like elements throughout. As used herein, the term "and/or" includes any and all combinations of one or more of the associated listed items.

It will be understood that, although the terms first, second, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

The terminology used herein is for the purpose of describing particular embodiments only, and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the pertinent art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Figure 2A:
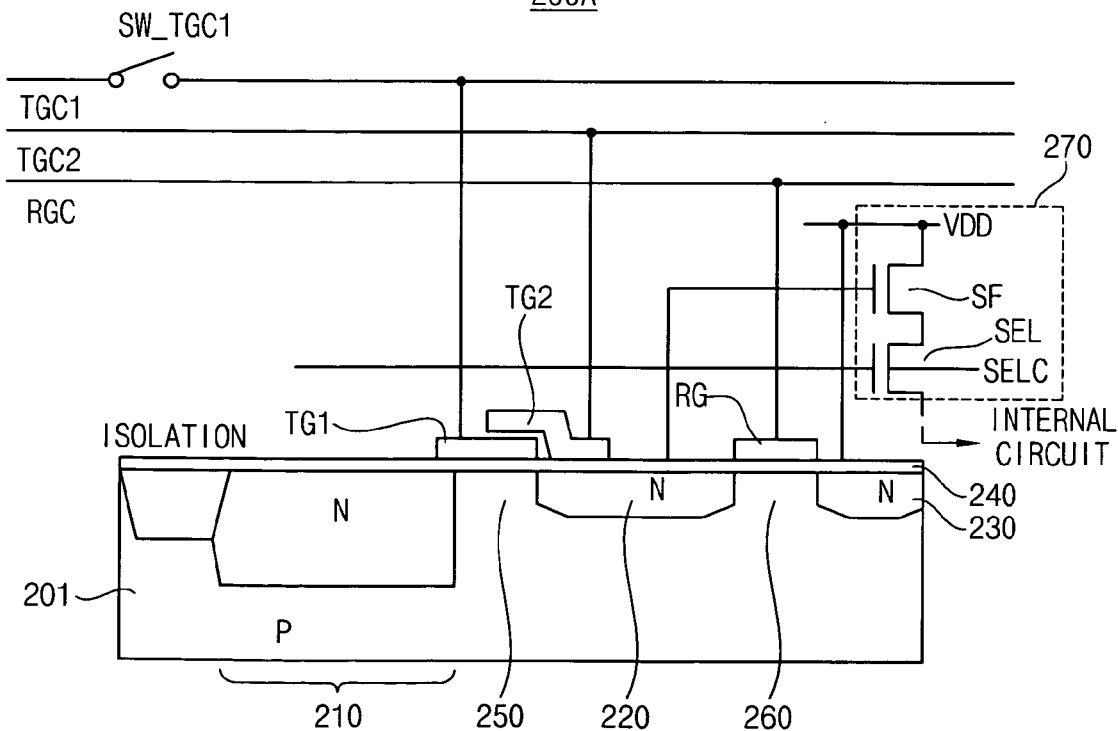
FIGS. 2A, 2B and 2C are cross-sectional views of a four-transistor CMOS APS according to exemplary embodiments of the present disclosure.

FIG. 2A is a cross-sectional view of a four-transistor CMOS APS according to embodiments of the disclosure. Referring to FIG. 2A, the four-transistor CMOS APS 200A includes a photodiode area 210 and N-type areas 220 and 230 formed on a P-type silicon substrate 201. An insulation layer 240 is formed on the photodiode area 210 and the N-type areas 220 and 230. The insulation layer 240 may include an SiO2 layer.

A first transfer gate electrode TG1, a second transfer gate electrode TG2 and a reset gate electrode RG are formed on the insulation layer 240. The first and second transfer gate electrodes TG1 and TG2 are respectively connected to a first transfer gate control line TGC1 and a second transfer gate control line TGC2. A reset gate control line RGC is connected to the reset gate electrode RG.

The four-transistor CMOS APS 200A further includes a signal transfer circuit 270. The signal transfer circuit 270 may have a source follower SF and a row selection transistor SEL for reading a potential of a floating diffusion node 220.

The photodiode area 210 appears to occupy a rather small area in the cross-sectional view, but occupies an area larger than the N-type areas 220 and 230, so as to sufficiently generate photoelectrons.

MOS transistors 250 and 260 are respectively formed by the N-type areas 220 and 230 along with the electrodes TG1, TG2 and RG on the insulation layer 240 of the silicon substrate.

The transfer transistor 250 transfers photoelectrons integrated within the photodiode 210 to the floating diffusion node 220, under the control of the first and second transfer gate electrodes TG1 and TG2. The reset transistor 260 resets an initial voltage of the floating diffusion node 220, under the control of the reset gate electrode RG.

The source follower transistor SF detects voltage changes of the floating diffusion node 220, and transfers the detected voltage of the floating diffusion node 220 to internal circuits in the next stage, under the control of the selection transistor SEL, which is turned on by a selection signal of the selection signal line SELC. The internal circuits may include an amplifier, a sampling circuit for sampling the transferred signal, and the like.

Comparing to the generally conventional active pixel sensor 100 in FIG. 1, the active pixel sensor 200A has a transfer transistor whose gate is a coupled gate composed of the first transfer gate electrode TG1 and the second transfer gate electrode TG2. The second transfer gate TG2 covers a portion of the first transfer gate TG1 and a portion of the floating diffusion node. The active pixel sensor 200A also has a switch SW_TGC1 which instantly prevents the first gate control line TGC1 from supplying a power supply voltage to the first transfer gate electrode TG1, and a second gate control line TGC2 for supplying a power supply voltage to the second transfer gate electrode TG2.

The active pixel sensor 200A, compared to the generally conventional active pixel sensor 100, has an advantage in that the active pixel sensor 200A bootstraps a gate bias voltage of the transfer transistor beyond a voltage level of the power supply voltage, such as about 1.7 to about 1.8 times higher than the voltage level of the power supply voltage, using a voltage coupling effect of the coupled transfer transistor configuration.

The initial potential of the floating diffusion node 220 may be raised higher in comparison with the conventional method, and the increased gate bias voltage of the transfer transistor may strengthen the transfer of the charges from the photodiode.

Therefore, the signal-to-noise ratio (SNR) and dynamic range (DR) of the CMOS active pixel sensor (APS) according to an exemplary embodiment of the present disclosure may be enhanced and increased, respectively, more than those of conventional APS.

A doping type of the above-described silicon substrate may be changed from a P type to an N type or from an N type to a P type according to a design scheme. In such cases, biasing conditions for the transfer transistor 250 and the reset transistor 260 may be necessarily adjusted according to the doping type.

Figure 2B:
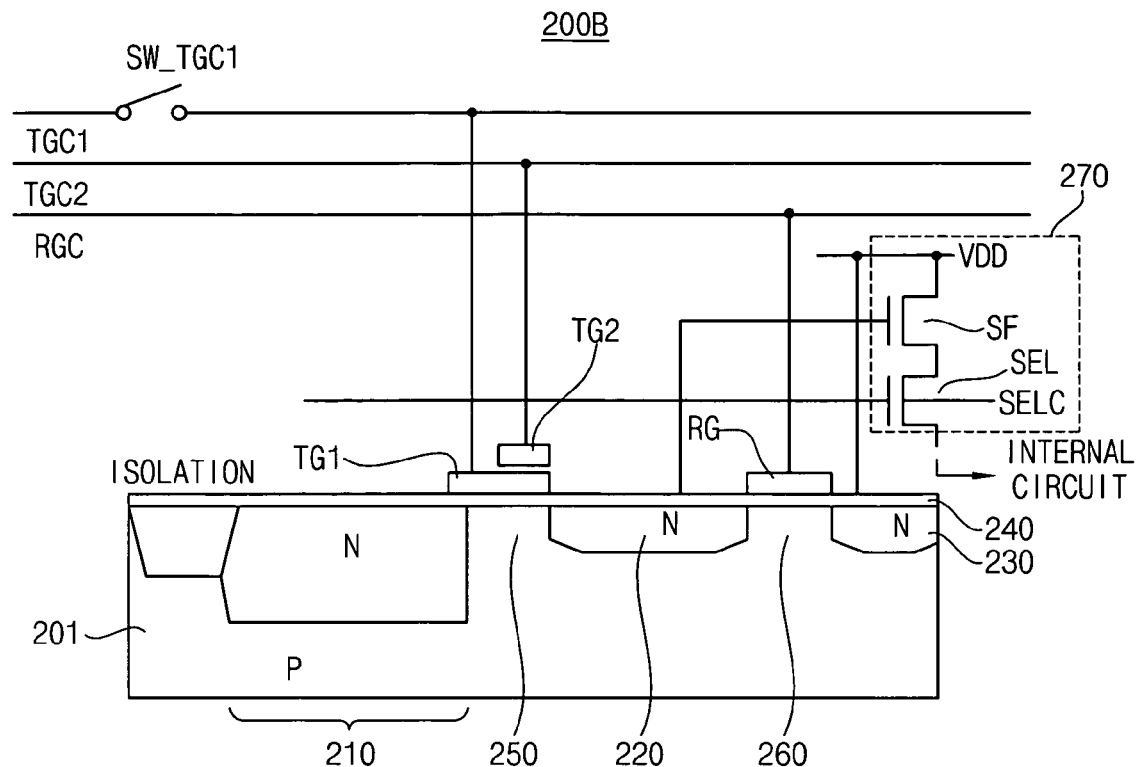

FIG. 2B is a cross-sectional view illustrating another embodiment of a four-transistor CMOS active pixel sensor according to the disclosure. Referring to FIG. 2B, another exemplary embodiment of a four-transistor CMOS active pixel sensor 200B is shown. A detailed description is omitted because most elements of the CMOS active pixel sensor 200B are substantially identical to the elements of the CMOS active pixel sensor 200A, except for the second transfer gate electrode TG2 in FIG. 2B. The second transfer gate electrode TG2 in FIG. 2B is formed only over the first transfer gate electrode TG1, and is not formed over the floating diffusion node 220.

Therefore, the voltage coupling effect, described in FIG. 2A, influences the first transfer gate electrode TG1, and bootstraps a voltage of the first transfer gate electrode TG1. Thus, in the embodiment of FIG. 2B, the transfer of electric charges from the photodiode may be strengthened due to the increased gate bias voltage of the transfer transistor.

Figure 2C:
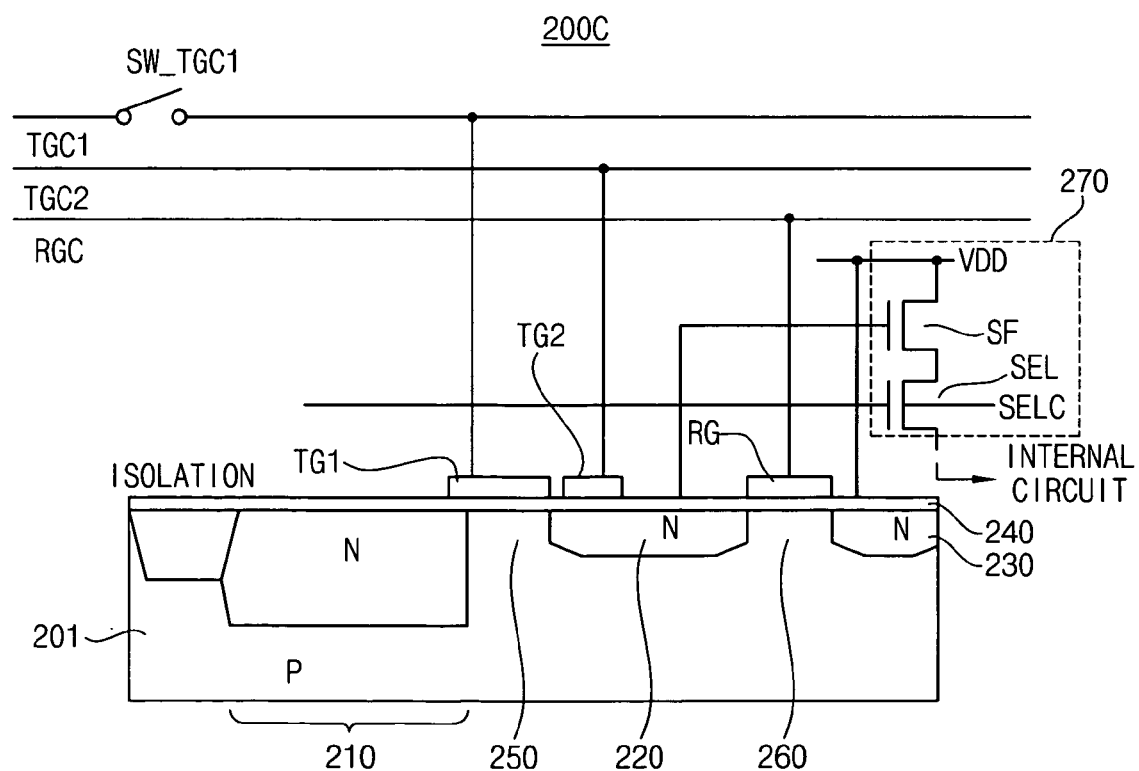

FIG. 2C is a cross-sectional view illustrating another embodiment of a four-transistor CMOS active pixel sensor according to the disclosure. Referring to FIG. 2C, another exemplary embodiment of a four-transistor CMOS active pixel sensor 200C is shown. A detailed description is omitted because most elements of the CMOS active pixel sensor 200C are substantially identical to the elements of the CMOS active pixel sensor 200A, except for the second transfer gate electrode TG2 in FIG. 2C. The second transfer gate electrode TG2 in FIG. 2C is formed only over the floating diffusion node 220, and is not formed over the first transfer gate electrode TG1.

Therefore, the voltage coupling effect, described with FIG. 2A, influences the floating diffusion node 220, and bootstraps a voltage of the floating diffusion node 220. Thus, in the embodiment of FIG. 2C, a higher SNR and a wider dynamic range may be obtained due to the increased initial potential of the floating diffusion node 220.

Figure 3:
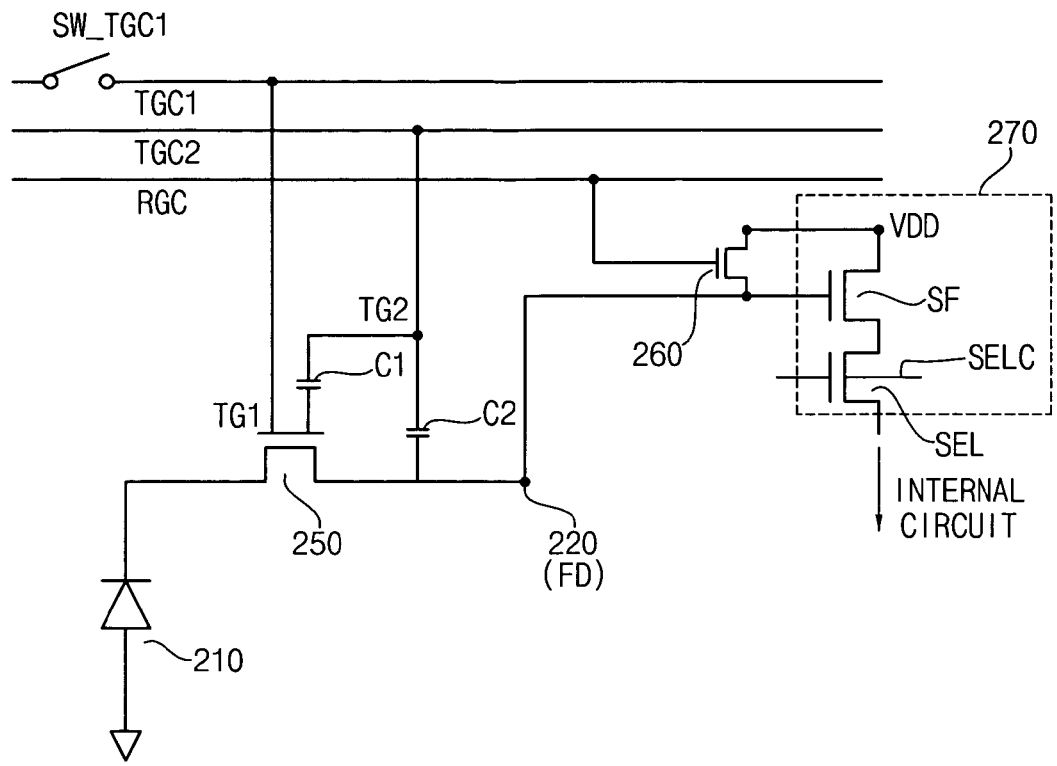
FIG. 3 is a circuit diagram illustrating a four-transistor CMOS active pixel sensor according to an exemplary embodiment of the present disclosure.

FIG. 3 is a circuit diagram illustrating a four-transistor CMOS active pixel sensor according to another embodiment of the disclosure. Referring to FIG. 3, a circuit model, which is simplified from the four-transistor CMOS active pixel sensor 200A, is shown. Capacitances C1 and C2 are shown between the first transfer gate electrode TG1 and the second transfer gate electrode TG2, which is constructed as a coupled structure over the first transfer gate electrode TG1 of the transfer transistor.

Figure 4:
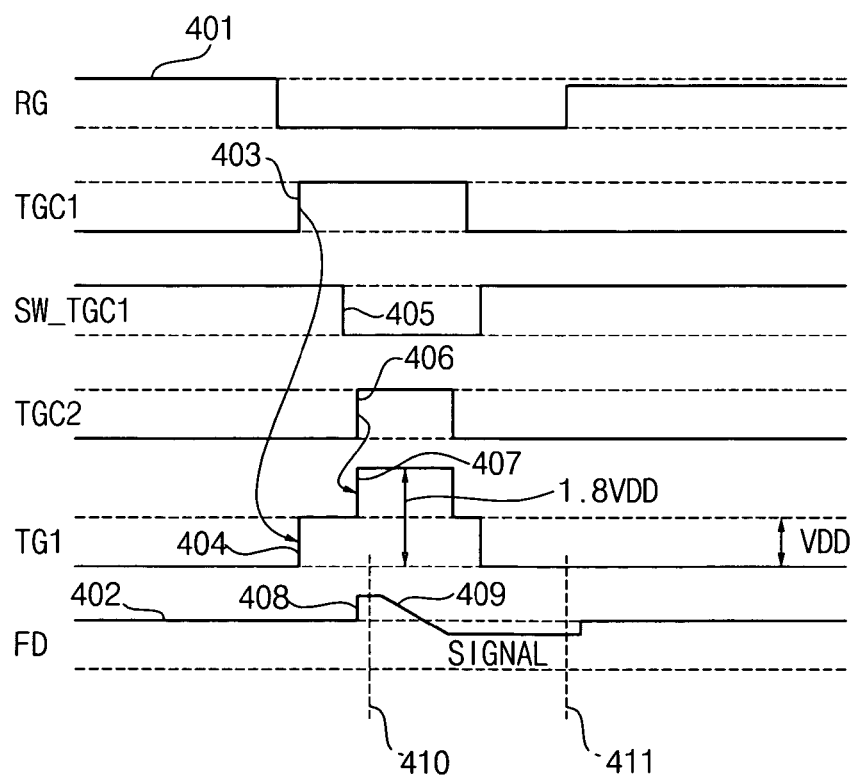
FIG. 4 is a timing diagram illustrating operations of a four-transistor CMOS active pixel sensor according to an exemplary embodiment of the present disclosure.

The following timing diagram in FIG. 4 can illustrate operations of the four-transistor CMOS active pixel sensors 200A, 200B and 200C according to the disclosure in FIGS. 2A, 2B, 2C and 3. FIG. 4 is a timing diagram illustrating operations of the four-transistor CMOS active pixel sensor according to the disclosure. Referring to FIG. 4, the operations of the four-transistor CMOS active pixel sensor 200A are described.

When a power supply voltage VDD is applied to the reset gate electrode RG through the reset gate control line RGC1, the voltage level of the reset gate electrode RG substantially rises up to the power supply voltage VDD (401), and the potential level of the floating diffusion node FD also substantially rises up to the power supply voltage VDD (402).

Next, the power supply voltage VDD is applied to the first transfer gate electrode TG1 through the first transfer gate control line TGC1 (403). Then, the voltage level of the first transfer gate electrode TG1 rises substantially up to the power supply voltage (404).

The switch SW_TGC1 placed on the first transfer gate control line TGC1 instantly prevents the power supply voltage from being applied to the first transfer gate electrode TG1 (405), so that the first transfer gate electrode TG1 is at a floating state.

Right after the switch SW_TGC1 instantly prevents the power supply voltage from being applied to the first transfer gate electrode TG1, the power supply voltage VDD is instantly applied to the second transfer gate electrode TG2 through the second transfer gate control line TGC2 (406).

The voltage level of the first transfer gate electrode TG1 instantly jumps up above the power supply voltage level, for example, to about 1.7 to about 1.8 times as high as the power supply voltage level, due to the coupling effect caused by the power supply voltage instantly applied to the second transfer gate electrode TG2 (407).

As for the active pixel sensor 200A in FIG. 2A, the potential level of the floating diffusion node 220 (FD) rises up as the voltage level of the first transfer gate electrode TG1 rises up (408). Then the source follower transistor senses the rising potential level of the floating diffusion node FD (410). The sensed potential level of the floating diffusion node FD becomes a first sampling voltage for a correlated double sampling.

As electric charges integrated within the photodiode flow to the floating diffusion node FD through a channel formed under the transfer transistor, the potential level of the floating diffusion node FD becomes lower (409).

Next, the source follower transistor SF senses the decreasing potential level of the floating diffusion node FD (411). The sensed potential level of the floating diffusion node FD becomes a second sampling voltage for the correlated double sampling.

Detailed operations of the source follower transistor and row selection transistor are omitted because the operations are substantially identical to the above-mentioned operations in a typical active pixel.

As described above, the potential level of the floating diffusion node FD also rises when the voltage level of the first transfer gate electrode TG1 rises higher than the power supply voltage level. A potential difference at the floating diffusion node becomes larger.

Because a higher bias voltage is applied to the transfer gate electrode due to the potential coupling effect, electric charges integrated within the photodiode area may be drained out at one sensing operation and image lag effects may become negligible.

As for the active pixel sensor 200B in FIG. 2B, the potential level of the floating diffusion node FD doesn't rise up because the second transfer gate electrode TG2 is placed only over the first transfer gate electrode TG1. Therefore, the benefit is that the voltage level of the first transfer gate electrode TG1 rises up to about 1.8 times as high as the power source voltage. The rise of the gate bias voltage of the transfer transistor strengthens transfer of the charges from the photodiode.

Figure 5A:
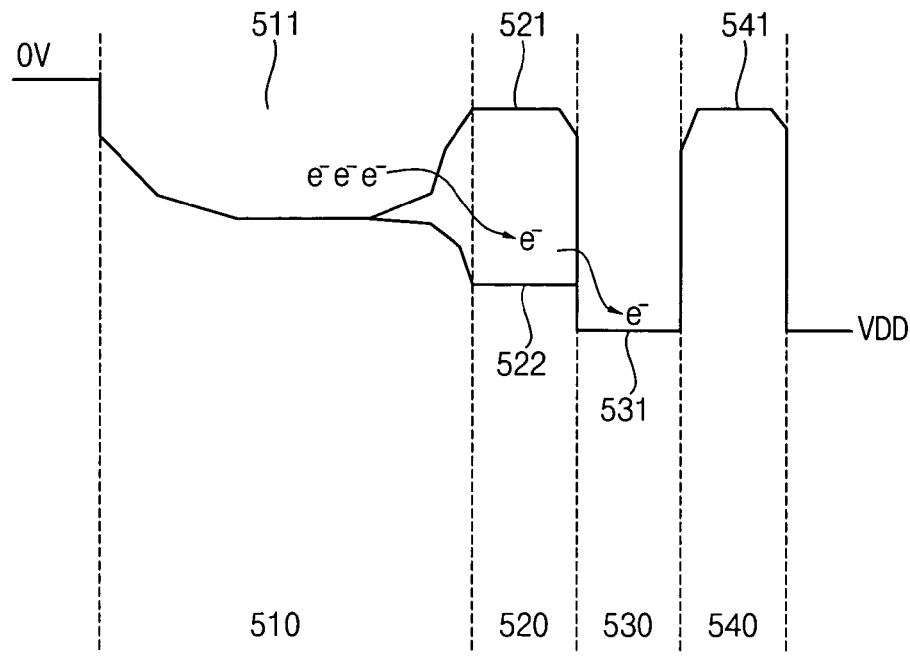
FIG. 5A is a surface potential diagram of a four-transistor CMOS active pixel sensor according to a generally conventional example.

As for the active pixel sensor 200C in FIG. 2C, the voltage level of the first transfer gate electrode TG1 doesn't rise up because the second transfer gate electrode TG2 is placed only above the floating diffusion node FD. Therefore, the benefit is that the potential level of the floating diffusion node FD rises up to about 1.8 times as high as the power source voltage. The rise of the initial potential level of the floating diffusion node FD brings a higher SNR and a wider dynamic range. FIG. 5A is a surface potential diagram of a four-transistor CMOS active pixel sensor according to a generally conventional example. Referring to FIG. 5A, the conventional 4-transistor CMOS active pixel sensor 100 in FIG. 1 has four potential sections, a potential 510 of the photodiode area 110, a lower potential 520 under the transfer gate electrode TG, a potential 530 of the floating diffusion node 120 and a lower potential 540 of the reset gate electrode RG.

The photodiode area 110 has a potential well. The lower potential 520 is maintained at a low potential level (521) during the photo integration period and the lower potential 540 is maintained at a low potential level (541). However, the potential 530 of the floating diffusion node 120 is increased to the level (531) corresponding to the level of the power supply voltage VDD due to the previous operation of the reset transistor. The potential level (531) of the floating diffusion node is sampled by the source follower transistor SF and the row selection transistor SEL, to then be used as a first sampling potential for the correlated double sampling.

During the photo integration period, electrons are deposited in the potential well formed at the photodiode area (511). At the end of the photo integration period, the power supply voltage is applied to the transfer gate electrode TG by the transfer gate control line TGC, and the lower potential 520 of the transfer gate electrode rises up to a potential level 522. The electrons integrated within the potential well are transferred to the floating diffusion node 120, and the potential level 530 of the floating diffusion node is lowered. The lowered potential level 530 of the floating diffusion node is sampled by the source follower transistor SF and the row selection transistor SEL, to then be used as a second sampling potential for the correlated double sampling.

Figure 5B:
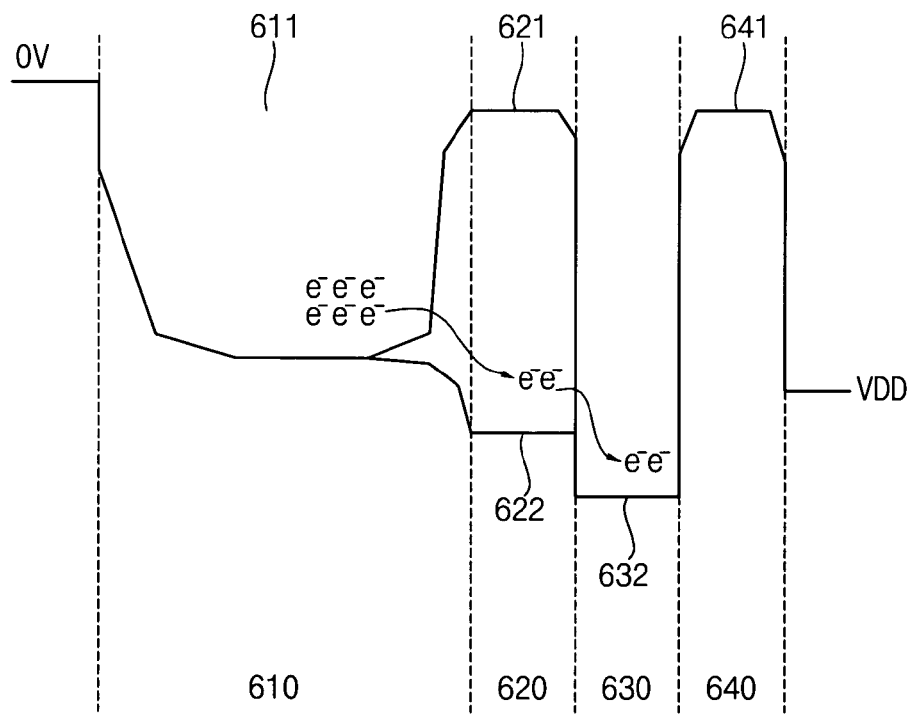
FIG. 5B is a surface potential diagram of a four-transistor CMOS active pixel sensor according to an exemplary embodiment of the present disclosure.

FIG. 5B is a surface potential diagram of a 4-transistor CMOS active pixel sensor 200A according to the present disclosure. Referring to FIG. 5B, the 4-transistor CMOS active pixel sensor 200A has four potential sections, a potential 610 of the photodiode area 210, a lower potential 620 under the first transfer gate electrode TG1, a potential 630 of the floating diffusion node 220 and a lower potential 640 of the reset gate electrode RG.

The photodiode area 210 has a potential well. The lower potential 620 of the first transfer gate electrode TG1 is maintained at a low potential level (621) during the photo integration period and the lower potential 640 of the reset gate electrode RG is also maintained at a low potential level (641). However, the potential 630 of the floating diffusion node 220 is increased at the level (631) corresponding to the level of the power supply voltage VDD due to the previous operation of the reset transistor.

During the photo integration period, electrons are deposited in the potential well formed at the photodiode area (611). At the end of the photo integration period, the power supply voltage is applied to the first transfer gate electrode TG1 through the transfer gate control line TGC, and the lower potential 620 of the first transfer gate electrode rises up to a potential level 622. The active pixel sensor 200A has the coupled structure of the first transfer gate electrode TG1 and the second transfer gate electrode TG2 which are respectively under the control of the first transfer gate control line TGC1 and the second transfer gate control line TGC2. As described above with respect to FIG. 4, the lower potential 620 of the first transfer gate electrode rises up to a potential level 622 due to the potential coupling effect, which is higher than the potential level 522 according to conventional examples.

Therefore, the photodiode area 220 has a deeper potential well than the photodiode area 120 according to conventional examples, such that the photodiode area 220 has a substantially increased capacity of photo-generated charges in the photodiode area 220 to increase a dynamic range of the light signal sensed by the active pixel sensor.

The potential level of the floating diffusion node 220 rises up to a potential level 632, which is higher than the potential level 531 according to the conventional examples. The potential level 632 of the floating diffusion node 220 is sampled by the source follower transistor and the row selection transistor, and the sampled potential level becomes a first sampled potential for the correlated double sampling.

The electric charges deposited in the potential well formed at the photodiode area 210 are transferred to the floating diffusion node 220, and the potential level of the floating diffusion node 220 is lowered. Comparing to the diagram in FIG. 5A, the variation at the potential level 620 of the transfer gate electrode TG and the potential level 630 of the floating diffusion node 220 are more steep than the conventional examples, such that a transfer of the charges integrated in the potential well to the floating diffusion node 220 is more strengthened.

The first sampled potential 632 of the floating diffusion node 220 has a higher potential level than the first sampled potential 531 of the floating diffusion node 120 in FIG. 5A due to the potential coupling effect. A larger potential drop due to charges influent from the photodiode area 220 may improve the dynamic range of signals.

Figure 6:
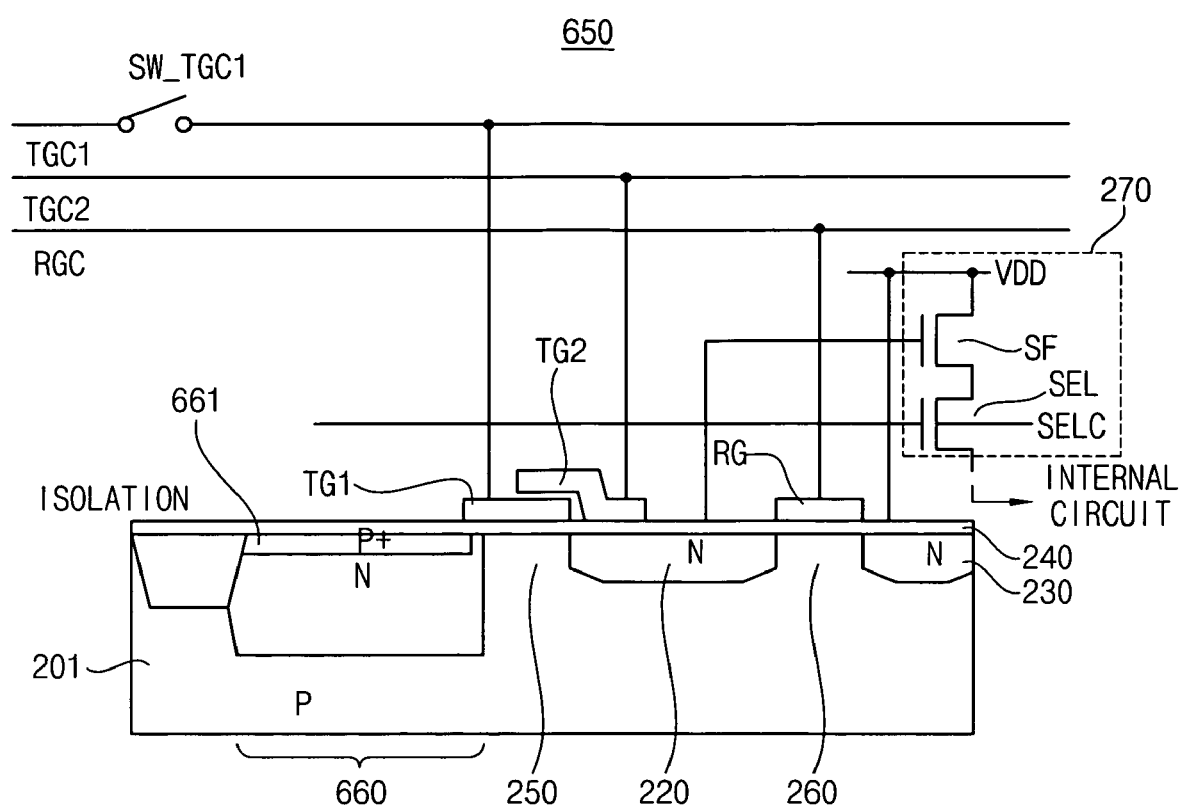
FIG. 6 is a cross-sectional diagram illustrating a CMOS active pixel sensor with a pinned photodiode according to another exemplary embodiment of the present disclosure.

FIG. 6 is a cross-sectional diagram illustrating a CMOS active pixel sensor according to the disclosure with a pinned photodiode. Referring to FIG. 6, an active pixel sensor 650 according to the disclosure includes a pinned photodiode 660 having a pinned surface 661. The active pixel sensor 650 has a substantially identical structure to that of the active pixel sensor 200 in FIGS. 2A, 2B and 2C except for a structure of the photodiode.

The pinned photodiode 660 additionally has a heavily doped p-type pinned surface 661 in a photodiode 660, which includes an n-type area on a p-type silicon substrate. The pinned photodiode 660, which effectively has a pnp junction structure, fully depletes the n-type region, and depletion regions are expanded respectively toward the upper p-type region and the lower p-type region of the n-type region. By adjusting doping concentrations of the upper and lower p-type regions of the n-type region, the depletion region of the lower p-type region may be expanded much deeper. Therefore, the pinned photodiode 660 may have a wide depletion region, which is expanded deeply toward the substrate 201, to increase a light sensitivity of the photodiode.

Figure 7:
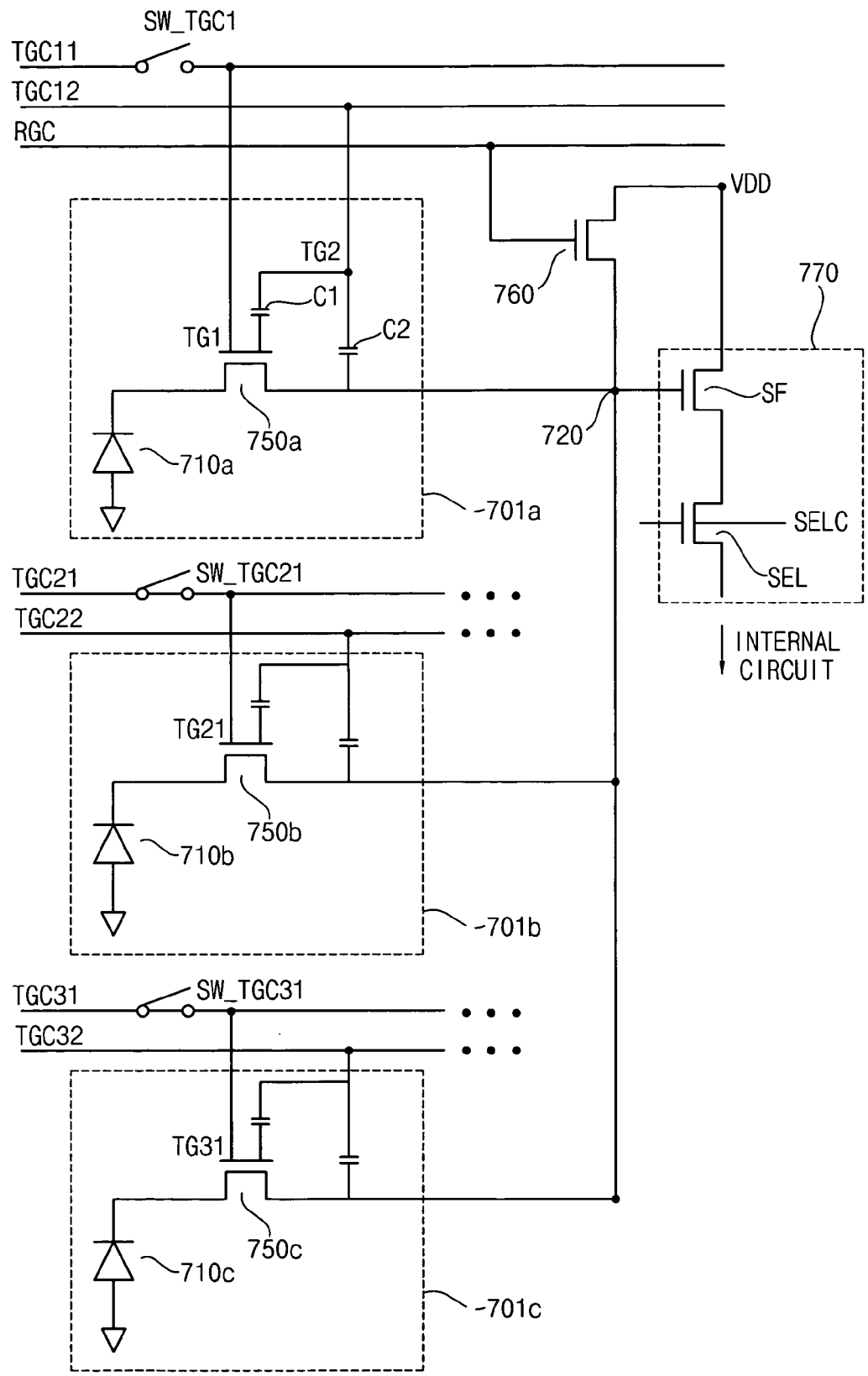
FIG. 7 is a circuit diagram illustrating a CMOS active pixel sensor array with a shared structure according to another exemplary embodiment of the present disclosure.

FIG. 7 is a circuit diagram illustrating an embodiment of the CMOS active pixel sensor array according to the disclosure, applied to a shared structure. FIG. 7 illustrates an embodiment of the active pixel sensor 200 according to the disclosure. The APS 200 has a pixel array with a shared structure, which can improve a fill factor, that is, a ratio of a photodiode area. The photodiode area converts incident light to photoelectric charges, with respect to an area occupied by the reset transistor and the signal transfer circuit.

Referring to FIG. 7, the pixel array 700, including the active pixel sensors, has a shared structure in which multiple pixels, such as three pixels, for example, are shared with one reset transistor 760 and one signal transfer circuit 770. The number of the pixels of the shared structure may be changed according to configurations and requirements of the application or consumer product.

The pixel array 700 includes three pixels 710a, 710b and 710c, which are respectively composed of a photodiode and a transfer transistor. For example, the first pixel 701a includes a photodiode 710a and a transfer transistor 750a constructed as a coupled structure. The transfer transistor of the first pixel 701a is coupled to first and second control lines TGC11 and TGC12 and to a switch SW_TGC11. The second and third pixels 701b and 701c are configured with the same structure.

Comparing to the active pixel sensor 200 with a single pixel configuration, the pixels 701a, 701b and 701c of the pixel array 700 in FIG. 7 share the reset transistor 760 and the signal transfer circuit 770 including a source follower transistor SF and a selection transistor SEL, in addition to a floating diffusion node 720.

Transfer transistors 750a, 750b and 750c, included respectively within the pixels 701a, 701b and 701c, transfer photoelectric charges integrated in the corresponding photodiodes 710a, 710b and 710c to the floating diffusion node 720, in sequence. In other words, the transfer transistors 750a, 750b and 750c respectively transfer the photoelectric charges integrated in the corresponding photodiodes 710a, 710b and 710c to the floating diffusion node 720 sequentially, under the controls of the first and second gate control lines TGC11, TGC12, TGC21, TGC22, TGC31 and TGC32 and the switches SW_TGC11, SW_TGC21 and SW_TGC31. The source follower transistor SF and the selection transistor SEL transfer the potential level of the floating diffusion node 720 to an internal circuit.

FIG. 8 is a circuit diagram illustrating an embodiment of the CMOS active pixel sensor according to the disclosure and applied to a multilayer photodiode structure. To capture color images, an array of pixels absorbing different frequencies, namely red, green and blue (RGB) pixels, typically has pixel mosaic patterns such as a Bayer color filter array (CFA). However, such color filter array methods perform sampling of the images locally due to wide distances between sensors, and the color pixels of the sampled images are not aligned, and thus causing color aliasing.

As alternatives for such a color filter array method, a method using a multilayer structure may be used. In the method using a multilayer structure, pn junctions having different depths are formed in a silicon substrate so as to absorb light with different frequencies or wavelengths corresponding to the respective pn junctions. Such a method, sensing light with different frequencies at different areas in a photodiode, is disclosed in U.S. Pat. Nos. 5,965,875 and 6,606,120. FIG. 8 illustrates a circuit diagram of an embodiment according to the disclosure that senses colors by a photodiode with the multilayer structure.

Referring to FIG. 8, a photodiode 810 is a photodiode with the multilayer structure. The photodiode 810 includes a p-type region 812 and n-type regions formed with different depths for absorbing different frequencies.

For example, the photodiode 810 may include an n-type region 811 formed on a p-type substrate, a p-type region 812 formed in the n-type region 811, and another n-type region 813 formed in the p-type region 812. Therefore, the pn junctions of the multilayer structure, respectively respond to different frequencies, thereby respectively sensing information of different colors.

Floating diffusion nodes 820a, 820b and 820c, corresponding to each of the wells 811, 812 and 813 in the photodiode 810, are reset with reset potentials 861a, 861b and 861c, respectively, by corresponding reset transistors 860a, 860b and 860c. The reset potential 861b of the p-type region 812 has a lower potential than the reset potentials 861a and 861b of the n-type regions 811 and 813, because different reset potentials are required according to the kind of electric charges integrated in the regions.

Duplicate detailed descriptions are omitted because other elements such as transfer transistors 850a, 850b and 850c, and signal transfer circuits 870a, 870b and 870c, which respectively include source follower transistors SF1, SF2 and SF3 and selection transistors SEL1, SEL2 and SEL3, have substantially identical structures and operations to the active pixel sensor 200A in FIG. 2A.

According to the exemplary embodiments of the disclosure, the 4-transistor CMOS active pixel sensors with the coupled gate structures may increase capacities of the photodiodes and reduce image lag by using the voltage coupling effect that raises the gate bias voltage of the transfer transistor and the initial potential of the floating diffusion node over the power source voltage.

The foregoing is illustrative of the present invention and is not to be construed as limiting thereof. Although a few exemplary embodiments of this invention have been described, those skilled in the pertinent art will readily appreciate that many modifications are possible in the exemplary embodiments without materially departing from the novel teachings and advantages of this invention. Accordingly, all such modifications are intended to be included within the scope of this invention as defined in the appended claims. In the claims, means-plus-function clauses are intended to cover the structures described herein as performing the recited function, and not only structural equivalents but also structures for performing equivalent functions.

Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims and all of their proper equivalents.

What is claimed is:

1. A complementary metal-oxide semiconductor (CMOS) active pixel sensor comprising:
   a photodiode disposed to generate electric charges in response to an incident light;
   a transfer transistor disposed to transfer the electric charges integrated in the photodiode to a floating diffusion node, wherein the transfer transistor has a first transfer gate and a second transfer gate, and the first and second transfer gates have a coupled gate structure;
   a reset transistor disposed to reset a potential level of the floating diffusion node by a given voltage level; and
   a signal transfer circuit disposed to transfer the potential level of the floating diffusion node to an internal circuit in response to a selection signal,
   wherein the transfer transistor is disposed to bootstrap a voltage of the second transfer gate by using a voltage coupling effect between the first transfer gate and the second transfer gate before it transfers the electric charges integrated in the photodiode to the floating diffusion node,
   wherein the first transfer gate is disposed over an entire channel region, and
   wherein the second transfer gate is disposed over at least a portion of the first transfer gate and at least a portion of the floating diffusion node.

2. The CMOS active pixel sensor of claim 1, wherein the second transfer gate is disposed substantially over the first transfer gate.

3. The CMOS active pixel sensor of claim 1, wherein the second transfer gate is disposed substantially over the floating diffusion node.

4. The CMOS active pixel sensor of claim 1, further comprising:
   a first transfer gate control line through which a power supply voltage is provided to the first transfer gate of the transfer transistor;
   a second transfer gate control line through which the power source voltage is provided to the second transfer gate of the transfer transistor; and
   a switch disposed to connect and disconnect the power supply voltage to the first transfer gate.

5. The CMOS active pixel sensor of claim 4, wherein the CMOS active pixel sensor is disposed to couple the power supply voltage to the first transfer gate by the switch during a given time period before disconnecting the power supply voltage, and then couple the power supply voltage to the second transfer gate, while the first transfer gate is at a floating state, to bootstrap a voltage level of the second transfer gate above the power source voltage by the voltage coupling effect.

6. The CMOS active pixel sensor of claim 5, wherein the potential level of the floating diffusion node is sampled by a correlated double sampling method, where a first sampling is performed while the voltage level of the second transfer gate is bootstrapped over the power source voltage by the voltage coupling effect.

7. The CMOS active pixel sensor of claim 1, wherein the signal transfer circuit comprises:
   a source follower transistor disposed to receive the potential level of the floating diffusion node via a gate of the source follower transistor; and
   a selection transistor disposed to transfer the potential level of a source of the source follower transistor to the internal circuit in response to the selection signal.

8. The CMOS active pixel sensor of claim 1, wherein the photodiode comprises a pinned photodiode having a pinned surface.

9. A shared structure active pixel sensor array with a plurality of complementary metal-oxide semiconductor (CMOS) active pixel sensors, the shared structure active pixel sensor array comprising:
   a plurality of photodiodes disposed to generate electric charges responding to incident light;
   a plurality of transfer transistors disposed to transfer the electric charges integrated in the photodiodes to a floating diffusion node, wherein each of the transfer transistors have a first transfer gate and a second transfer gate, and the first and second transfer gates are configured as a coupled gate structure;
   a reset transistor disposed to reset a potential level of the floating diffusion node by a given voltage level; and
   a signal transfer circuit disposed to transfer the potential level of the floating diffusion node to an internal circuit in response to a selection signal,
   wherein each of the transfer transistors is disposed to bootstrap a voltage of the second transfer gate by using a voltage coupling effect between the first transfer gate and the second transfer gate before transfers the electric charges integrated in the photodiode to the floating diffusion node,
   wherein the first transfer gate is disposed over an entire channel region, and
   wherein the second transfer gate is disposed over at least a portion of the first transfer gate and at least a portion of the floating diffusion node.

10. The shared structure active pixel sensor array of claim 9, wherein the second transfer gate is disposed substantially over the first transfer gate.

11. The shared structure active pixel sensor array of claim 9, wherein the second transfer gate is disposed over the floating diffusion node.

12. The shared structure active pixel sensor array of claim 9, wherein each of the CMOS active pixel sensors comprises:
- a first transfer gate control line through which a power supply voltage is provided to the first transfer gate of the transfer transistor;
- a second transfer gate control line through which the power supply voltage is provided to the second transfer gate of the transfer transistor; and
- a switch disposed to connect and disconnect the power supply voltage to the first transfer gate.

13. The shared structure active pixel sensor array of claim 12, wherein each of the CMOS active pixel sensors couples the power supply voltage to the first transfer gate by the switch during a given time period before disconnecting the power supply voltage, and then couples the power supply voltage to the second transfer gate, while the first transfer gate is at a floating state, to bootstrap the voltage level of the second transfer gate above the power supply voltage by a voltage coupling effect.

14. The shared structure active pixel sensor array of claim 13, wherein each of the CMOS active pixel sensors samples the potential level of the floating diffusion node by a correlated double sampling method, where a first sampling is performed while the voltage level of the second transfer gate is bootstrapped over the power supply voltage by the voltage coupling effect.

15. The shared structure active pixel sensor array of claim 9, wherein the signal transfer circuit comprises:
- a source follower transistor for receiving the potential level of the floating diffusion node via a gate of the source follower transistor; and
- a selection transistor for transferring the potential level of a source of the source follower transistor to the internal circuit in response to the selection signal.

16. The shared structure active pixel sensor array of claim 9, wherein each of the photodiodes comprises a pinned photodiode having a pinned surface.

* * * * *